United States Patent
Ker et al.

(10) Patent No.: US 10,312,791 B1
(45) Date of Patent: Jun. 4, 2019

(54) NEGATIVE HIGH-VOLTAGE GENERATION DEVICE WITH MULTI-STAGE SELECTION

(71) Applicant: National Chiao Tung University, Hsinchu (TW)

(72) Inventors: Ming-Dou Ker, Jhu-bei (TW); Shiau-Pin Lin, Taichung (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 16/025,205

(22) Filed: Jul. 2, 2018

(51) Int. Cl.
*H02M 3/07* (2006.01)
*H02M 1/08* (2006.01)
*H03K 3/356* (2006.01)
*H02M 1/00* (2006.01)

(52) U.S. Cl.
CPC .............. *H02M 1/08* (2013.01); *H02M 3/07* (2013.01); *H03K 3/356113* (2013.01); *H02M 2001/0025* (2013.01); *H02M 2003/072* (2013.01)

(58) Field of Classification Search
CPC ..... H02M 2003/071; H02M 2003/072; H02M 2003/077; H02M 2003/075; H02M 3/07; H02M 3/072
See application file for complete search history.

(56) References Cited

U.S. PATENT DOCUMENTS

| | | | | |
|---|---|---|---|---|
| 5,831,844 A * | 11/1998 | Sudo | ...................... | H02M 3/073 363/60 |
| 5,917,366 A * | 6/1999 | Nakano | .................. | H02M 3/073 307/110 |
| 5,969,988 A * | 10/1999 | Tanzawa | ................ | G11C 5/145 365/185.17 |
| 5,999,040 A * | 12/1999 | Do | ......................... | H02M 3/073 327/534 |
| 6,404,272 B2 * | 6/2002 | Zanuccoli | ............. | H02M 3/073 327/536 |
| 6,486,728 B2 | 11/2002 | Kleveland | | |
| 6,819,162 B2 | 11/2004 | Pelliconi | | |
| 7,855,591 B2 * | 12/2010 | Racape | .................. | H02M 3/073 327/536 |
| 8,456,225 B1 | 6/2013 | Snowdon | | |
| 8,704,587 B2 * | 4/2014 | Rannanan | .............. | G11C 5/145 327/536 |
| 8,797,088 B2 | 8/2014 | Chan | | |
| 8,896,367 B1 * | 11/2014 | Lin | ....................... | H02M 3/073 327/536 |
| 2006/0250177 A1 * | 11/2006 | Thorp | ................... | H02M 3/073 327/536 |
| 2006/0273843 A1 * | 12/2006 | Daga | ..................... | H02M 3/073 327/536 |

(Continued)

*Primary Examiner* — Thomas J. Hiltunen
(74) *Attorney, Agent, or Firm* — Muncy, Geissler, Olds & Lowe, P.C.

(57) ABSTRACT

A negative high-voltage generation device with multi-stage selection includes an input, an output, negative charges pumps, electrical switches, and a control device. The negative charge pumps are electrically cascaded between the input and the output and configured to receive zero voltage through the input. The control device turns off at least one of the electrical switches close to the output and turns on the remains of the plurality of electrical switches, and the negative charge pumps and the electrical switches use zero voltage to generate a negative voltage at the output.

10 Claims, 7 Drawing Sheets

(56) References Cited

U.S. PATENT DOCUMENTS

| | | | | |
|---|---|---|---|---|
| 2010/0033232 A1* | 2/2010 | Pan | ............... | H02M 3/07 327/536 |
| 2012/0169407 A1* | 7/2012 | Noh | ............... | G11C 5/145 327/536 |
| 2012/0313694 A1* | 12/2012 | Noh | ............... | G11C 5/145 327/536 |

* cited by examiner

NEGATIVE HIGH-VOLTAGE GENERATION DEVICE WITH MULTI-STAGE SELECTION

BACKGROUND OF THE INVENTION

Field of the Invention

The present invention relates to a high-voltage generation device, particularly to a negative high-voltage generation device with multi-stage selection.

Description of the Related Art

Nowadays, many stimulators have been widely used as a kind of electrical stimulation treatment in medicine. During the therapeutic process, the dislocation between tissues and electrodes may cause the variation of impedances. Also, the effectiveness of stimulation may induce the change of stimulus scales. Therefore, the required supply for stimulators varies from several volts to tens of volts. It is important for the high-voltage generator to vary with stimulus conditions. In a closed-loop system, the output voltage of charge pumps can be re-arranged by varying the reference voltage.

At different reference voltages, the system uses phase frequency modulation (PFM) feedback to regulate the output voltage. Take U.S. Pat. No. 8,797,088 as an example. A charge pump unit can generate high voltage by switches and capacitors. The charge pump unit may be an N-stage negative charge pump, where N≥2. Many charge pump circuits and control techniques had been proposed. The closed-loop control of charge pump usually consists of a compensation unit, a modulation unit, and a phase control unit, as shown in FIG. 2A of the patent. The modulation unit can receive the output of compensation unit and generate a modulation signal to a phase control unit. The output voltage can regulate at a certain voltage by this control. However, it would suffer a low efficiency problem when an inappropriate negative voltage is targeted to output. Refer to FIG. 1. The 1-stage negative charge pump is used to generate a negative voltage −VDD. The 2-stage negative charge pump is used to generate a negative voltage −2VDD. The N-stage negative charge pump is used to generate a negative voltage −NVDD. Before reaching the negative target voltage, the power efficiency of the negative charge pump has decreased from 100%.

To overcome the abovementioned problems, the present invention provides a negative high-voltage generation device with multi-stage selection, so as to solve the aforementioned problems of the prior art.

SUMMARY OF THE INVENTION

The primary objective of the present invention is to provide a negative high-voltage generation device with multi-stage selection, which uses charge pumps each realized with a capacitive converter to generate a direct-current (DC) output voltage lower than an input voltage, reconfigures a cascaded architecture of charge pumps to reduce excessive power consumption, outputs a wide voltage range, and maintains high power conversion efficiency.

To achieve the abovementioned objectives, the present invention provides a negative high-voltage generation device with multi-stage selection having an input and an output. The negative high-voltage generation device with multi-stage selection comprises a plurality of negative charge pumps, a plurality of electrical switches, and a control device. The plurality of negative charge pumps are electrically cascaded between the input and the output and configured to receive zero voltage through the input. The plurality of electrical switches are coupled to the input. The control device is coupled to the plurality of electrical switches and configured to turn off at least one of the plurality of electrical switches close to the output and to turn on the remains of the plurality of electrical switches, and the plurality of negative charge pumps and the plurality of electrical switches are configured to use zero voltage to generate a negative voltage at the output.

In an embodiment of the present invention, the control device further comprises a stage controller, and a plurality of negative level shifters. The stage controller is configured to receive and output a plurality of control voltages and configured to generate a plurality of biasing voltages according to the plurality of control voltages. The plurality of negative level shifters are coupled to the stage controller and respectively coupled to the plurality of electrically switches. There is a node between neighboring two of the plurality of negative charge pumps, the node is coupled to one of the plurality of negative level shifters, and the output is coupled to one of the plurality of negative level shifters. The plurality of negative level shifters are configured to respectively receive the plurality of control voltages and to respectively receive the plurality of biasing voltages, thereby using the plurality of control voltages and the plurality of biasing voltages to turn off at least one of the plurality of electrical switches close to the output and to turn on the remains of the plurality of electrical switches. The plurality of negative charge pumps and the plurality of electrical switches are configured to use zero voltage to generate a negative voltage at the output. In an embodiment of the present invention, the plurality of electrical switches are N-channel metal oxide semiconductor field effect transistors (NMOSFETs).

In an embodiment of the present invention, each of the plurality of negative level shifters further comprises a first P-channel metal oxide semiconductor field effect transistors (PMOSFET), a first N-channel metal oxide semiconductor field effect transistors (NMOSFET), an inverter, a second P-channel metal oxide semiconductor field effect transistors (PMOSFET), a second N-channel metal oxide semiconductor field effect transistors (NMOSFET), and a buffer. The source of the first PMOSFET is coupled to the stage controller and configured to receive one of the plurality of biasing voltages, and the gate of the first PMOSFET is coupled to the stage controller and configured to receive one of the plurality of control voltages. The drain of the first NMOSFET is coupled to the drain of the first PMOSFET, and the source of the first NMOSFET is coupled to the output or the node and configured to receive a node voltage at the node or the negative voltage. For example, the node voltage is smaller than zero voltage. The input terminal of the inverter is coupled to the gate of the first PMOSFET and the stage controller and configured to receive one of the plurality of control voltages. The source of the second PMOSFET is coupled to the stage controller and the source of the first PMOSFET and configured to receive one of the plurality of biasing voltages, the gate of the second PMOSFET is coupled to the output terminal of the inverter, and the drain of the second PMOSFET is coupled to the gate of the first NMOSFET. The drain of the second NMOSFET is coupled to the drain of the second PMOSFET and the gate of the first NMOSFET, the gate of the second NMOSFET is coupled to the drains of the first NMOSFET and the first PMOSFET, and the source of the second NMOSFET is coupled to the output or the node and configured to receive the node voltage or the negative voltage. The input terminal of the buffer is coupled to the drains of the second NMOSFET and the second PMOSFET and the gate of the first NMOSFET. The output terminal of the buffer is coupled to one of the plurality of electrical switches, the first NMOSFET, the first PMOSFET, the second NMOSFET, the second PMOSFET, the inverter, and the buffer are configured to use one of the plurality of control voltages, one of the plurality of biasing voltages, and either of the node voltage or the negative voltage to turn on or turn off one of the plurality of electrical switches.

In an embodiment of the present invention, the output terminal of the buffer generates the node voltage or the negative voltage to turn off one of the plurality of electrical switches when the gate of the first PMOSFET and the input terminal of the inverter receive one of the plurality of control voltages equal to zero voltage.

In an embodiment of the present invention, the output terminal of the buffer generates one of the plurality of biasing voltages equal to a positive power voltage to turn on one of the plurality of electrical switches when the gate and the source of the first PMOSFET, the source of the second PMOSFET, and the input terminal of the inverter receive one of the plurality of biasing voltages equal to the positive power voltage.

In an embodiment of the present invention, each of the plurality of negative charge pumps is configured to receive a first clock signal, a second clock signal, a third clock signal, and a fourth clock signal and configured to use the first clock signal, the second clock signal, the third clock signal, the fourth clock signal, and either of one of the node voltages or zero voltage to generate another of the node voltages or the negative voltage, the first clock signal, the second clock signal, the third clock signal, and the fourth clock signal have an identical period, and the period includes a first duration, a second duration, a third duration, a fourth duration, a fifth duration, a sixth duration, a seventh duration, and an eighth duration sequentially appearing. The first clock signal, the second clock signal, the third clock signal, and the fourth clock signal are respectively zero voltage, zero voltage, the positive power voltage, and the positive power voltage in the first duration. The first clock signal, the second clock signal, the third clock signal, and the fourth clock signal are respectively zero voltage, zero voltage, zero voltage, and the positive power voltage in the second duration. The first clock signal, the second clock signal, the third clock signal, and the fourth clock signal are respectively zero voltage, zero voltage, zero voltage, and zero voltage in the third duration. The first clock signal, the second clock signal, the third clock signal, and the fourth clock signal are respectively zero voltage, the positive power voltage, zero voltage, and zero voltage in the fourth duration. The first clock signal, the second clock signal, the third clock signal, and the fourth clock signal are respectively the positive power voltage, the positive power voltage, zero voltage, and zero voltage in the fifth duration. The first clock signal, the second clock signal, the third clock signal, and the fourth clock signal are respectively zero voltage, the positive power voltage, zero voltage, and zero voltage in the sixth duration. The first clock signal, the second clock signal, the third clock signal, and the fourth clock signal are respectively zero voltage, zero voltage, zero voltage, and zero voltage in the seventh duration. The first clock signal, the second clock signal, the third clock signal, and the fourth clock signal are respectively zero voltage, zero voltage, zero voltage, and the positive power voltage in the eighth duration.

In an embodiment of the present invention, each of the plurality of negative charge pumps further comprises a first capacitor, a second capacitor, a third capacitor, a fourth capacitor, a third N-channel metal oxide semiconductor field effect transistor (NMOSFET), a fourth N-channel metal oxide semiconductor field effect transistor (NMOSFET), a fifth N-channel metal oxide semiconductor field effect transistor (NMOSFET), a sixth N-channel metal oxide semiconductor field effect transistor (NMOSFET), a seventh N-channel metal oxide semiconductor field effect transistor (NMOSFET), and an eighth N-channel metal oxide semiconductor field effect transistor (NMOSFET). The first capacitor has a first end and a second end. The first end of the first capacitor is configured to receive the first clock signal. The second capacitor has a third end and a fourth end. The third end of the second capacitor is configured to receive the second clock signal. The third capacitor has a fifth end and a sixth end. The fifth end of the third capacitor is configured to receive the third clock signal. The fourth capacitor has a seventh end and an eighth end. The seventh end of the fourth capacitor is configured to receive the fourth clock signal. The gate of the third NMOSFET is coupled to the second end, the drain of the third NMOSFET is coupled to the node or the input, and the source of the third NMOSFET is coupled to the fourth end. The drain of the fourth NMOSFET is coupled to the second end, the source of the fourth NMOSFET is coupled to the fourth end, and the gate of the fourth NMOSFET is coupled to the drain of the third NMOSFET. The drain of the fifth NMOSFET is coupled to the drain of the third NMOSFET, the gate of the fifth NMOSFET is coupled to the sixth end, and the source of the fifth NMOSFET is coupled to the eighth end. The drain of the sixth NMOSFET is coupled to the sixth end, the source of the sixth NMOSFET is coupled to the eighth end, and the gate of the sixth NMOSFET is coupled to the gate of the fourth NMOSFET. The drain of the seventh NMOSFET is coupled to the fourth end, the source of the seventh NMOSFET is coupled to the output or the node, and the gate of the seventh NMOSFET is coupled to the eighth end. The drain of the eighth NMOSFET is coupled to the eighth end, the source of the eighth NMOSFET is coupled to the source of the seventh NMOSFET, the gate of the eighth NMOSFET is coupled to the fourth end, and the first capacitor, the second capacitor, the third capacitor, the fourth capacitor, the third NMOSFET, the fourth NMOSFET, the fifth NMOSFET, the sixth NMOSFET, the seventh NMOSFET, and the eighth NMOSFET are configured to receive one of the node voltages or zero voltage and configured to decrease it by a fixed voltage to generate another of the node voltages or the negative voltage.

In an embodiment of the present invention, the fixed voltage is equal to the positive power voltage.

In an embodiment of the present invention, each of the plurality of control voltages is equal to zero voltage or the positive power voltage, and each of the plurality of biasing voltages is equal to the positive power voltage.

In an embodiment of the present invention, the negative high-voltage generation device further comprises a feedback controller coupled to the output and the plurality of negative charge pumps, configured to receive a reference voltage and the negative voltage, and configured to compare the reference voltage with the negative voltage to enable at least one of the plurality of negative charge pumps close to the output and to disable the remains of the plurality of negative charge pumps.

Below, the embodiments are described in detail in cooperation with the drawings to make easily understood the technical contents, characteristics and accomplishments of the present invention.

DETAILED DESCRIPTION OF THE INVENTION

Figure 1:
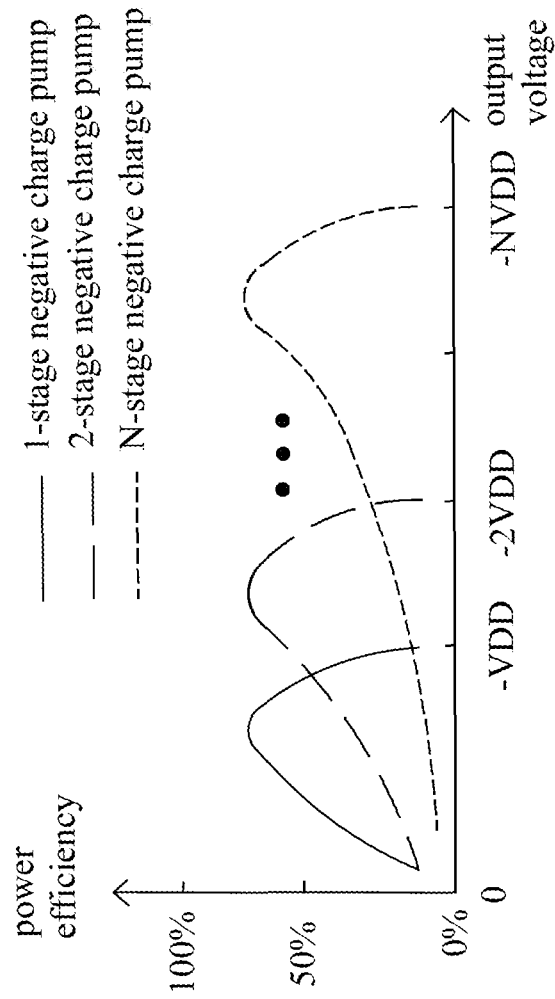
FIG. 1 is a diagram showing curves of power efficiency versus an output voltage for the conventional negative charge pumps.
Figure 2:
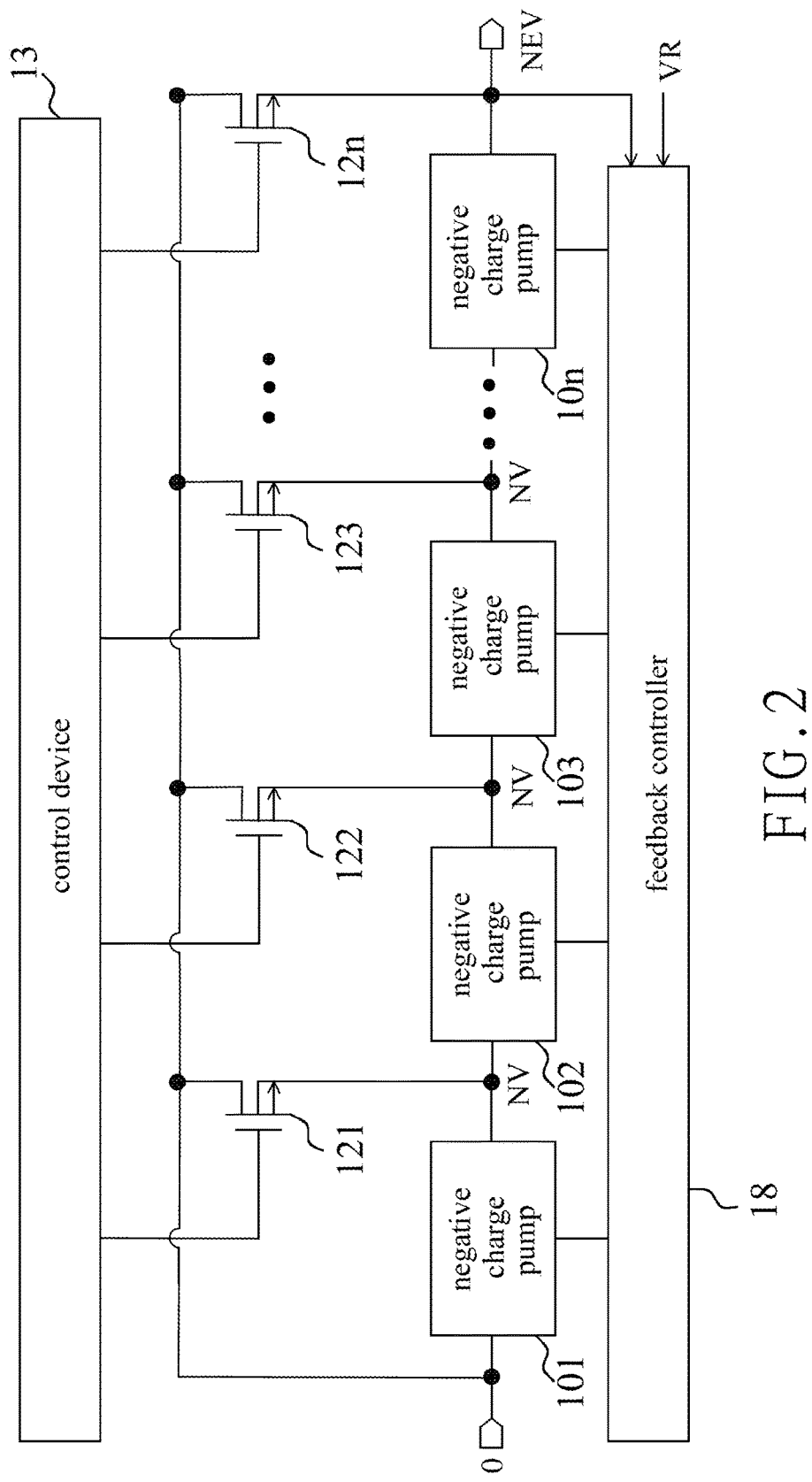
FIG. 2 is a diagram showing a negative high-voltage generation device with multi-stage selection according to the first embodiment of the present invention.
Figure 3:
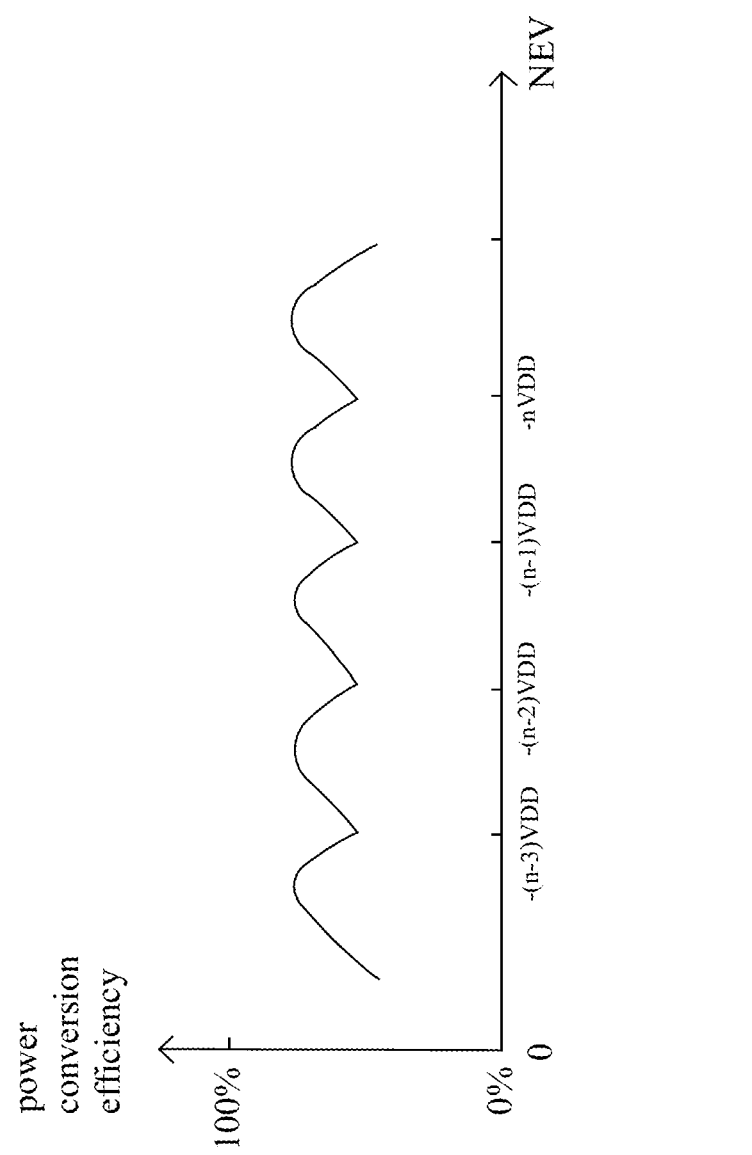
FIG. 3 is a diagram showing a curve of power efficiency versus a negative voltage for a negative high-voltage generation device with multi-stage selection according to an embodiment of the present invention.

Refer to FIG. 2 and FIG. 3. The first embodiment of the negative high-voltage generation device is introduced as follows. The negative high-voltage generation device with multi-stage selection has an input and an output. The negative high-voltage generation device with multi-stage selection comprises a plurality of negative charge pumps 101-10$n$, a plurality of electrical switches 121-12$n$, a control device 13, and a feedback controller 18, wherein n is a natural number larger than or equal to 2. The plurality of negative charge pumps 101-10$n$ are electrically cascaded between the input and the output and configured to receive zero voltage through the input. The plurality of electrical switches 121-12$n$ are coupled to the input. Each of the plurality of electrical switches 121-12$n$ is a bypass switch. The bypass switch is implemented by an N-type metal oxide semiconductor field effect transistor (NMOSFET) because it is easier to acquire a higher voltage level to fully turn it on. The control device 13 is coupled to the plurality of electrical switches 121-12$n$ and configured to turn off at least one of the plurality of electrical switches 121-12$n$ close to the output and to turn on the remains of the plurality of electrical switches 121-12$n$, and the plurality of negative charge pumps 101-10$n$ and the plurality of electrical switches 121-12$n$ are configured to use zero voltage to generate a negative voltage at the output. For example, each of the negative charge pumps decreases an input voltage by a positive power voltage VDD to generate an output voltage. The feedback controller 18 is coupled to the output and the plurality of negative charge pumps 101-10$n$, configured to receive a reference voltage VR and the negative voltage NEV, and configured to compare the reference voltage VR with the negative voltage NEV to enable at least one of the plurality of negative charge pumps 101-10$n$ close to the output and to disable the remains of the plurality of negative charge pumps 101-10$n$.

The operation of the first embodiment of the negative high-voltage generation device is introduced as follows.

The control device 13 fully turns off the electrical switches 121-12$n$. Besides, the feedback controller 18 compares the reference voltage VR with the negative voltage NEV to enable the plurality of negative charge pumps 101-10$n$. Thus, the negative charge pumps 101-10$n$ receive zero voltage and decrease it by nVDD to generate the negative voltage NEV at the output. In other words, the negative voltage NEV is −nVDD. Since the electrical switches 121-12$n$ are fully turned off to reduce excessive power consumption, the negative voltage NEV is stably maintained to achieve high power conversion efficiency.

The control device 13 fully turns on the electrical switch 121 and fully turns off the electrical switches 122-12$n$ close to the output. Besides, the feedback controller 18 compares the reference voltage VR with the negative voltage NEV to enable the plurality of negative charge pumps 102-10$n$ close to the output and to disable the negative charge pump 101. Thus, the negative charge pumps 102-10$n$ receive zero voltage through the electrical switch 121 and decrease it by (n−1)VDD to generate the negative voltage NEV at the output. In other words, the negative voltage NEV is −(n−1)VDD. Since the electrical switches 122-12$n$ are fully turned off to reduce excessive power consumption, the negative voltage NEV is stably maintained to achieve high power conversion efficiency.

The control device 13 fully turns on the electrical switches 121 and 122 and fully turns off the electrical switches 123-12$n$ close to the output. Besides, the feedback controller 18 compares the reference voltage VR with the negative voltage NEV to enable the plurality of negative charge pumps 103-10$n$ close to the output and to disable the negative charge pumps 101 and 102. Thus, the negative charge pumps 103-10$n$ receive zero voltage through the electrical switch 122 and decrease it by (n−2)VDD to generate the negative voltage NEV at the output. In other words, the negative voltage NEV is −(n−2)VDD. Since the electrical switches 123-12$n$ are fully turned off to reduce excessive power consumption, the negative voltage NEV is stably maintained to achieve high power conversion efficiency.

The control device 13 fully turns on the electrical switches 121-12($n$−1) and fully turns off the electrical switch 12$n$ close to the output. Besides, the feedback controller 18 compares the reference voltage VR with the negative voltage NEV to enable the plurality of negative charge pump 10$n$ close to the output and to disable the negative charge pumps 101-10($n$−1). Thus, the negative charge pump 10$n$ receives zero voltage through the electrical switch 12($n$−1) and decreases it by VDD to generate the negative voltage NEV at the output. In other words, the negative voltage NEV is −VDD. Since the electrical switch 12$n$ is fully turned off to reduce excessive power consumption, the negative voltage NEV is stably maintained to achieve high power conversion efficiency.

Figure 4:
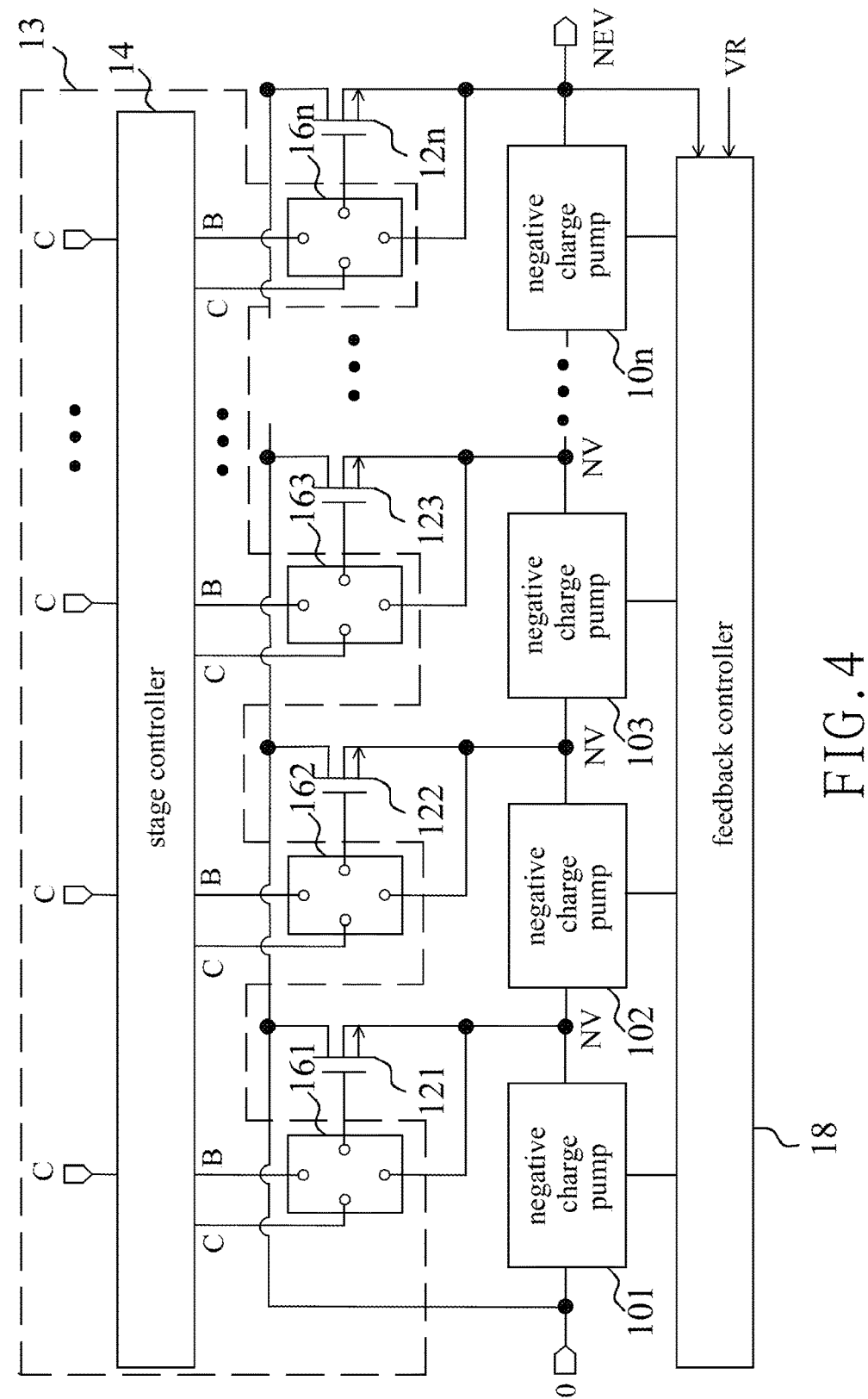
FIG. 4 is a diagram showing a negative high-voltage generation device with multi-stage selection according to the second embodiment of the present invention.

Refer to FIG. 4. The second embodiment of the negative high-voltage generation device is introduced as follows.

The second embodiment is different from the first embodiment in the control device 13. In the second embodiment, the control device 13 further comprises a stage controller 14 and a plurality of negative level shifters 161-16$n$. The stage controller 14 is configured to receive and output a plurality of control voltages C and configured to generate a plurality of biasing voltages B according to the plurality of control voltages C. For example, each of the plurality of control voltages C is equal to zero voltage or a positive power voltage VDD, and each of the plurality of biasing voltages B is equal to the positive power voltage VDD. The plurality of negative level shifters 161-16n are coupled to the stage controller 14 and respectively coupled to the plurality of electrically switches 121-12n. There is a node between neighboring two of the plurality of negative charge pumps 101-10n, the node is coupled to one of the plurality of negative level shifters 161-16n, and the output is coupled to one of the plurality of negative level shifters 161-16n. The plurality of negative level shifters 161-16n are configured to respectively receive the plurality of control voltages C and to respectively receive the plurality of biasing voltages B, thereby using the plurality of control voltages C and the plurality of biasing voltages B to turn off at least one of the plurality of electrical switches 121-12n close to the output and to turn on the remains of the plurality of electrical switches 121-12n. In order to fully turn on or turn off the plurality of electrical switches 121-12n, the negative level shifters 161-16n are used to shift the signal to different voltage level. In the present invention, the negative level shifters 161-16n are designated to convert signals from positive to negative. When the control voltages C received by the negative level shifters 161-16n are zero voltage, the negative level shifters 161-16n turn off the electrical switches 121-12n. When the control voltages C received by the negative level shifters 161-16n are the positive power voltage VDD, the negative level shifters 161-16n turn on the electrical switches 121-12n. The plurality of negative charge pumps 101-10n and the plurality of electrical switches 121-12n are configured to use zero voltage to generate a negative voltage NEV at the output. For example, each of the negative charge pumps decreases an input voltage by the positive power voltage VDD to generate an output voltage. The feedback controller 18 is coupled to the output and the plurality of negative charge pumps 101-10n, configured to receive a reference voltage VR and the negative voltage NEV, and configured to compare the reference voltage VR with the negative voltage NEV to enable at least one of the plurality of negative charge pumps 101-10n close to the output and to disable the remains of the plurality of negative charge pumps 101-10n.

Refer to FIG. 3 and FIG. 4. The operation of the first embodiment of the negative high-voltage generation device is introduced as follows.

When the control voltages C received by the negative level shifters 161-16n are zero voltage, the negative level shifters 161-16n use the control voltages C and the biasing voltages B to fully turn off the electrical switches 121-12n. Besides, the feedback controller 18 compares the reference voltage VR with the negative voltage NEV to enable the plurality of negative charge pumps 101-10n. Thus, the negative charge pumps 101-10n receive zero voltage and decrease it by nVDD to generate the negative voltage NEV at the output. In other words, the negative voltage NEV is −nVDD. Since the electrical switches 121-12n are fully turned off to reduce excessive power consumption, the negative voltage NEV is stably maintained to achieve high power conversion efficiency.

When the control voltage C received by the negative level shifter 161 is the positive power voltage VDD, the negative level shifter 161 uses the control voltage C and the biasing voltage B to fully turn on the electrical switch 121. When the control voltages C received by the negative level shifters 162-16n are zero voltage, the negative level shifters 162-16n use the control voltages C and the biasing voltages B to fully turn off the electrical switches 122-12n close to the output. Besides, the feedback controller 18 compares the reference voltage VR with the negative voltage NEV to enable the plurality of negative charge pumps 102-10n close to the output and to disable the negative charge pump 101. Thus, the negative charge pumps 102-10n receive zero voltage through the electrical switch 121 and decrease it by (n−1) VDD to generate the negative voltage NEV at the output. In other words, the negative voltage NEV is −(n−1)VDD. Since the electrical switches 122-12n are fully turned off to reduce excessive power consumption, the negative voltage NEV is stably maintained to achieve high power conversion efficiency.

When the control voltages C received by the negative level shifters 161 and 162 are the positive power voltage VDD, the negative level shifters 161 and 162 use the control voltages C and the biasing voltages B to fully turn on the electrical switches 121 and 122. When the control voltages C received by the negative level shifters 163-16n are zero voltage, the negative level shifters 163-16n use the control voltages C and the biasing voltages B to fully turn off the electrical switches 123-12n close to the output. Besides, the feedback controller 18 compares the reference voltage VR with the negative voltage NEV to enable the plurality of negative charge pumps 103-10n close to the output and to disable the negative charge pumps 101 and 102. Thus, the negative charge pumps 103-10n receive zero voltage through the electrical switch 122 and decrease it by (n−2) VDD to generate the negative voltage NEV at the output. In other words, the negative voltage NEV is (n−2)VDD. Since the electrical switches 123-12n are fully turned off to reduce excessive power consumption, the negative voltage NEV is stably maintained to achieve high power conversion efficiency.

When the control voltages C received by the negative level shifters 161-16(n−1) are the positive power voltage VDD, the negative level shifters 161-16(n−1) use the control voltages C and the biasing voltages B to fully turn on the electrical switches 121-12(n−1). When the control voltage C received by the negative level shifter 16n is zero voltage, the negative level shifter 16n uses the control voltage C and the biasing voltage B to fully turn off the electrical switch 12n close to the output. Besides, the feedback controller 18 compares the reference voltage VR with the negative voltage NEV to enable the plurality of negative charge pump 10n close to the output and to disable the negative charge pumps 101-10(n−1). Thus, the negative charge pump 10n receives zero voltage through the electrical switch 12(n−1) and decreases it by VDD to generate the negative voltage NEV at the output. In other words, the negative voltage NEV is −VDD. Since the electrical switch 12n is fully turned off to reduce excessive power consumption, the negative voltage NEV is stably maintained to achieve high power conversion efficiency.

Figure 5:
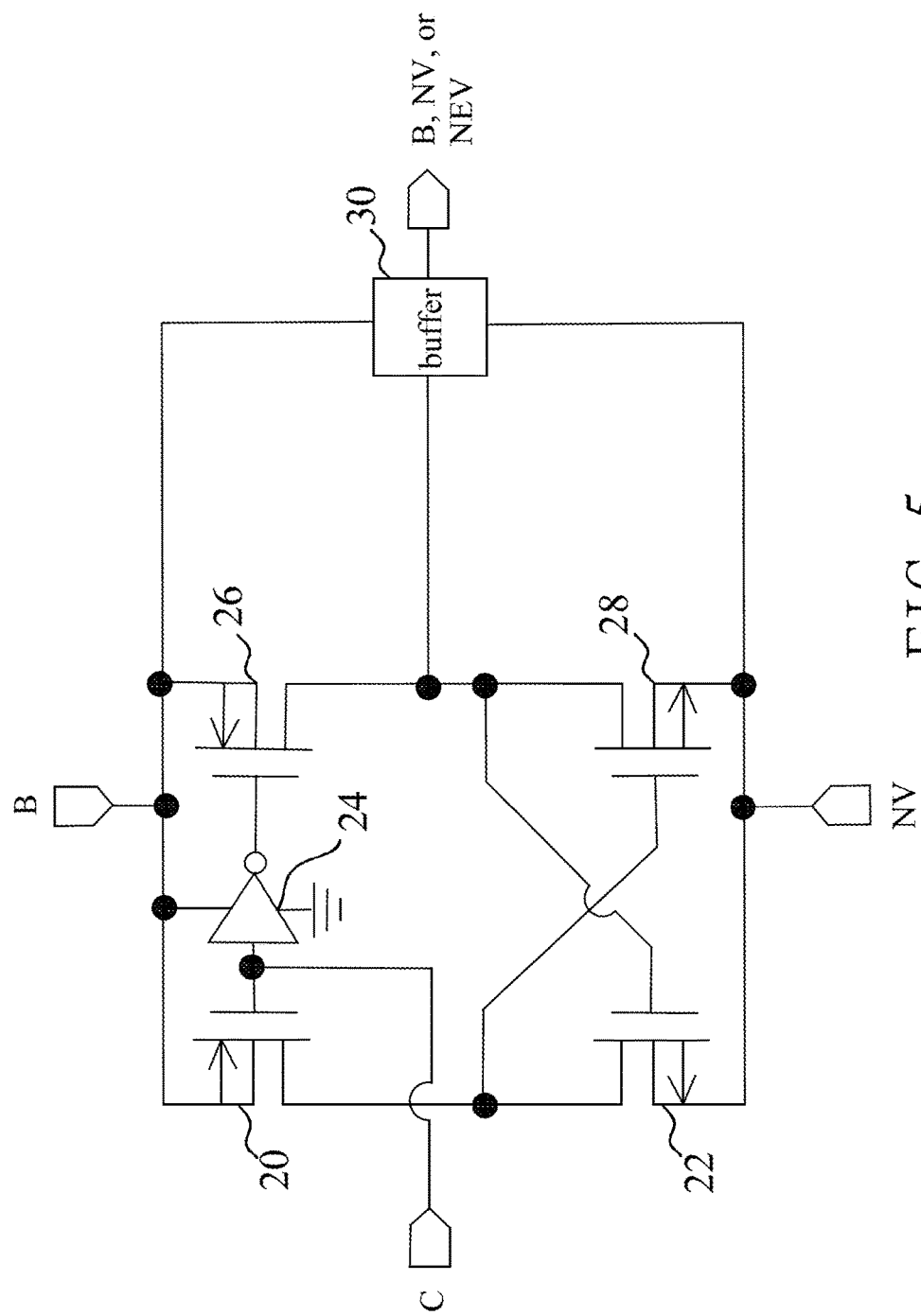
FIG. 5 is a diagram showing a negative level shifter according to an embodiment of the present invention.

Each of the plurality of negative level shifters 161-16n may be shown in FIG. 5, but the present invention is not limited thereto. Refer to FIG. 5. Each of the plurality of negative level shifters 161-16n further comprises a first P-channel metal oxide semiconductor field effect transistors (PMOSFET) 20, a first N-channel metal oxide semiconductor field effect transistors (NMOSFET) 22, an inverter 24, a second P-channel metal oxide semiconductor field effect transistors (PMOSFET) 26, a second N-channel metal oxide semiconductor field effect transistors (NMOSFET) 28, and a buffer 30. The source of the first PMOSFET 20 is coupled to the stage controller 14 and configured to receive one of the plurality of biasing voltages B, and the gate of the first PMOSFET 20 is coupled to the stage controller 14 and configured to receive one of the plurality of control voltages C. The drain of the first NMOSFET 22 is coupled to the drain of the first PMOSFET 20, and the source of the first NMOSFET 22 is coupled to the output or the node and configured to receive a node voltage NV at the node or the negative voltage NEV. For example, the node voltage NV is smaller than zero voltage. The input terminal of the inverter 24 is coupled to the gate of the first PMOSFET 20 and the stage controller 14 and configured to receive one of the plurality of control voltages C. The source of the second PMOSFET 26 is coupled to the stage controller 14 and the source of the first PMOSFET 20 and configured to receive one of the plurality of biasing voltages B, the gate of the second PMOSFET 26 is coupled to the output terminal of the inverter 24, and the drain of the second PMOSFET 26 is coupled to the gate of the first NMOSFET 22. The drain of the second NMOSFET 28 is coupled to the drain of the second PMOSFET 26 and the gate of the first NMOSFET 22, the gate of the second NMOSFET 28 is coupled to the drains of the first NMOSFET 22 and the first PMOSFET 20, and the source of the second NMOSFET 28 is coupled to the output or the node and configured to receive the node voltage NV or the negative voltage NEV. The input terminal of the buffer 30 is coupled to the drains of the second NMOSFET 28 and the second PMOSFET 26 and the gate of the first NMOSFET 22. The output terminal of the buffer 30 is coupled to one of the plurality of electrical switches 121-12n. The first NMOSFET 22, the first PMOSFET 20, the second NMOSFET 28, the second PMOSFET 26, the inverter 24, and the buffer 30 are configured to use one of the plurality of control voltages C, one of the plurality of biasing voltages B, and either of the node voltage NV or the negative voltage NEV to turn on or turn off one of the plurality of electrical switches 121-12n. In operation, the output terminal of the buffer 30 generates the node voltage NV or the negative voltage NEV to turn off one of the plurality of electrical switches 121-12n when the gate of the first PMOSFET 20 and the input terminal of the inverter 24 receive one of the plurality of control voltages C equal to zero voltage. The output terminal of the buffer 30 generates one of the plurality of biasing voltages B equal to the positive power voltage VDD to turn on one of the plurality of electrical switches 121-12n when the gate and the source of the first PMOSFET 20, the source of the second PMOSFET 26, and the input terminal of the inverter 24 receive one of the plurality of biasing voltages B equal to the positive power voltage VDD.

Figure 6:
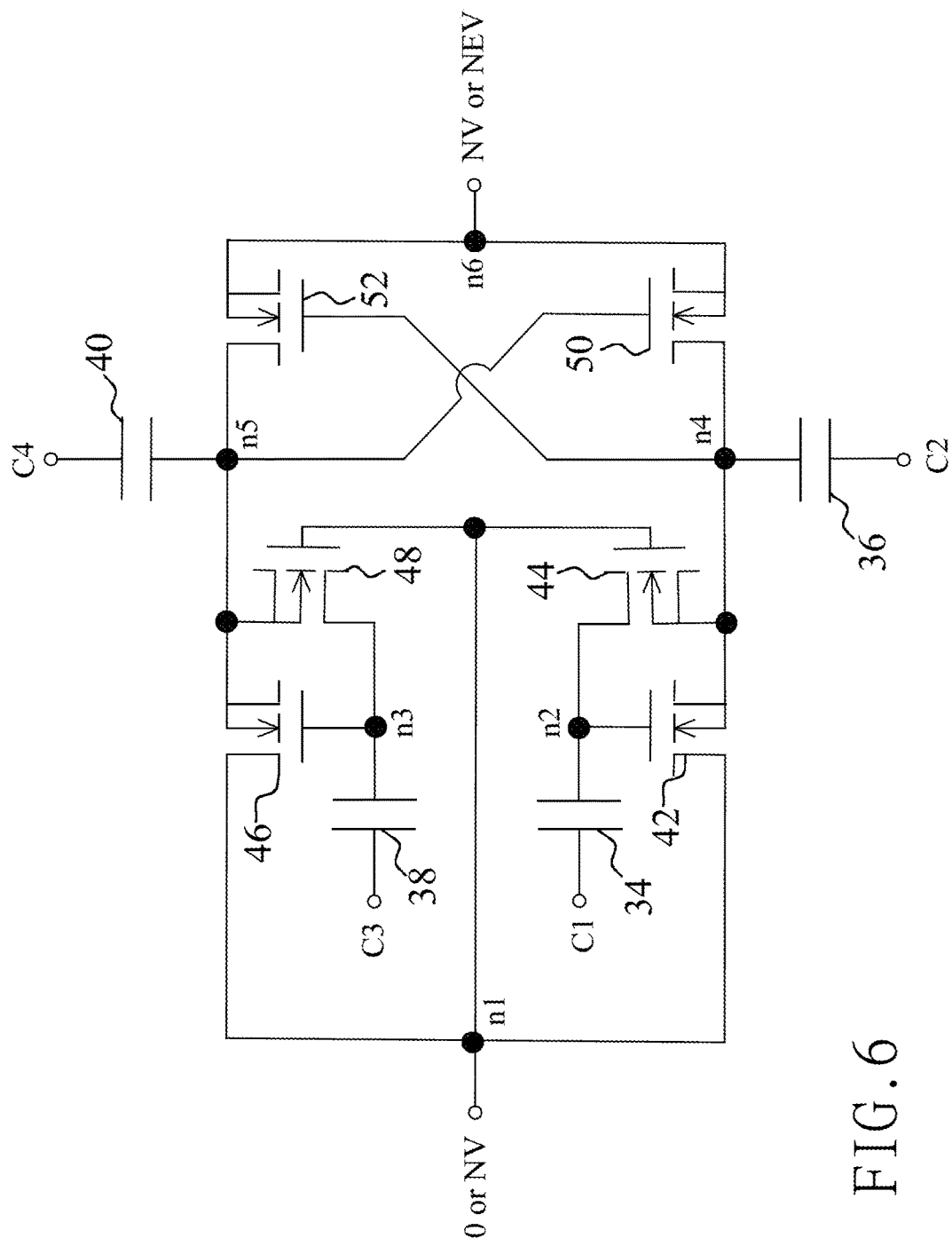
FIG. 6 is a diagram showing a negative charge pump according to an embodiment of the present invention.
Figure 7:
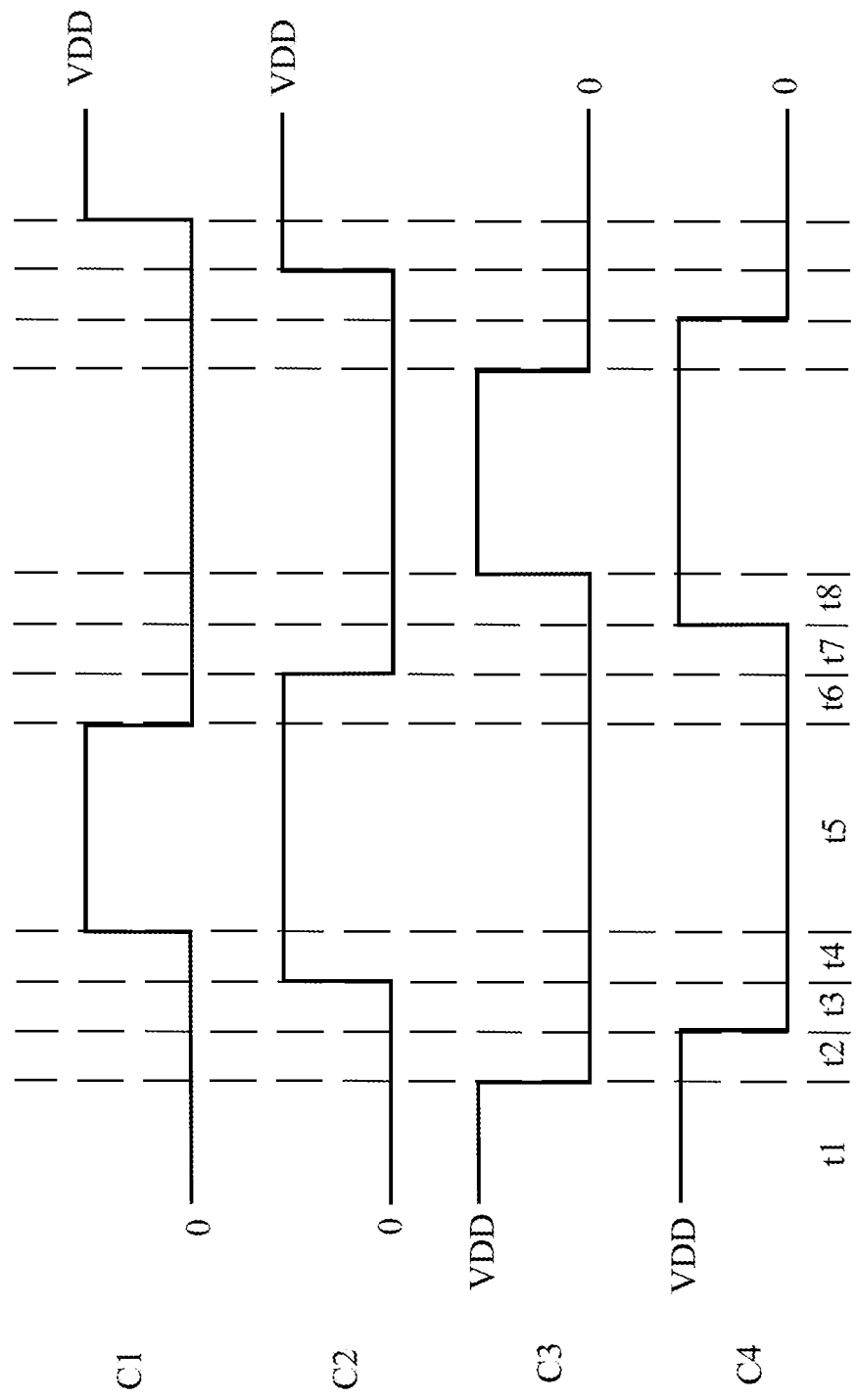
FIG. 7 is a diagram showing waveforms of a first clock signal, a second clock signal, a third clock signal, and a fourth clock signal according to an embodiment of the present invention.

Each of the negative charge pumps 101-10n may be shown in FIG. 6, but the present invention is not limited thereto. Refer to FIG. 6 and FIG. 7. The core of each of the negative charge pumps 101-10n is a four-phase cross-couple structure. It can not only reduce the output ripple but also avoid gate-oxide reliability issues. In order to isolate a P-well of each NMOSFET from a P-substrate, the negative charge pump consists of only NMOS switches with a deep N-Well. Moreover, the bulk and the source of each NMOS switch are connected to each other. As a result, the NMOS switches do not have body effect and any substrate leakage.

Each of the plurality of negative charge pumps 101-10n is configured to receive a first clock signal C1, a second clock signal C2, a third clock signal C3, and a fourth clock signal C4 and configured to use the first clock signal C1, the second clock signal C2, the third clock signal C3, the fourth clock signal C4, and either of one of the node voltages NV or zero voltage to generate another of the node voltages NV or the negative voltage NEV. The first clock signal C1, the second clock signal C2, the third clock signal C3, and the fourth clock signal C4 have an identical period, and the period includes a first duration t1, a second duration t2, a third duration t3, a fourth duration t4, a fifth duration t5, a sixth duration t6, a seventh duration t7, and an eighth duration t8 sequentially appearing. The first clock signal C1, the second clock signal C2, the third clock signal C3, and the fourth clock signal C4 are respectively zero voltage, zero voltage, the positive power voltage VDD, and the positive power voltage VDD in the first duration t1. The first clock signal C1, the second clock signal C2, the third clock signal C3, and the fourth clock signal C4 are respectively zero voltage, zero voltage, zero voltage, and the positive power voltage VDD in the second duration t2. The first clock signal C1, the second clock signal C2, the third clock signal C3, and the fourth clock signal C4 are respectively zero voltage, zero voltage, zero voltage, and zero voltage in the third duration t3. The first clock signal C1, the second clock signal C2, the third clock signal C3, and the fourth clock signal C4 are respectively zero voltage, the positive power voltage VDD, zero voltage, and zero voltage in the fourth duration t4. The first clock signal C1, the second clock signal C2, the third clock signal C3, and the fourth clock signal C4 are respectively the positive power voltage VDD, the positive power voltage VDD, zero voltage, and zero voltage in the fifth duration t5. The first clock signal C1, the second clock signal C2, the third clock signal C3, and the fourth clock signal C4 are respectively zero voltage, the positive power voltage VDD, zero voltage, and zero voltage in the sixth duration t6. The first clock signal C1, the second clock signal C2, the third clock signal C3, and the fourth clock signal C4 are respectively zero voltage, zero voltage, zero voltage, and zero voltage in the seventh duration t7. The first clock signal C1, the second clock signal C2, the third clock signal C3, and the fourth clock signal C4 are respectively zero voltage, zero voltage, zero voltage, and the positive power voltage VDD in the eighth duration t8.

Each of the plurality of negative charge pumps 101-10n further comprises a first capacitor 34, a second capacitor 36, a third capacitor 38, a fourth capacitor 40, a third N-channel metal oxide semiconductor field effect transistor (NMOSFET) 42, a fourth N-channel metal oxide semiconductor field effect transistor (NMOSFET) 44, a fifth N-channel metal oxide semiconductor field effect transistor (NMOSFET) 46, a sixth N-channel metal oxide semiconductor field effect transistor (NMOSFET) 48, a seventh N-channel metal oxide semiconductor field effect transistor (NMOSFET) 50, and an eighth N-channel metal oxide semiconductor field effect transistor (NMOSFET) 52. The first capacitor 34 has a first end and a second end. The first end of the first capacitor 34 is configured to receive the first clock signal C1. The second capacitor 36 has a third end and a fourth end. The third end of the second capacitor 36 is configured to receive the second clock signal C2. The third capacitor 38 has a fifth end and a sixth end. The fifth end of the third capacitor 38 is configured to receive the third clock signal C3. The fourth capacitor 40 has a seventh end and an eighth end. The seventh end of the fourth capacitor 40 is configured to receive the fourth clock signal C4. The gate of the third NMOSFET 42 is coupled to the second end, the drain of the third NMOSFET 42 is coupled to the node or the input, and the source of the third NMOSFET 42 is coupled to the fourth end. The drain of the fourth NMOSFET 44 is coupled to the second end, the source of the fourth NMOSFET 44 is coupled to the fourth end, and the gate of the fourth NMOSFET 44 is coupled to the drain of the third NMOSFET 42. The drain of the fifth NMOSFET 46 is coupled to the drain of the third NMOSFET 42, the gate of the fifth NMOSFET 46 is coupled to the sixth end, and the source of the fifth NMOSFET 46 is coupled to the eighth end. The drain of the sixth NMOSFET 48 is coupled to the sixth end, the source of the sixth NMOSFET 48 is coupled to the eighth end, and the gate of the sixth NMOSFET 48 is coupled to the gate of the fourth NMOSFET 44. The drain of the seventh NMOSFET 50 is coupled to the fourth end, the source of the seventh NMOSFET 50 is coupled to the output or the node, and the gate of the seventh NMOSFET 50 is coupled to the eighth end. The drain of the eighth NMOSFET 52 is coupled to the eighth end, the source of the eighth NMOSFET 52 is coupled to the source of the seventh NMOSFET 50, the gate of the eighth NMOSFET 52 is coupled to the fourth end, and the first capacitor 34, the second capacitor 36, the third capacitor 38, the fourth capacitor 40, the third NMOSFET 42, the fourth NMOSFET 44, the fifth NMOSFET 46, the sixth NMOSFET 48, the seventh NMOSFET 50, and the eighth NMOSFET 52 are configured to receive one of the node voltages NV or zero voltage and configured to decrease it by a fixed voltage equal to the positive power voltage VDD to generate another of the node voltages NV or the negative voltage NEV.

The transition of each of the negative charge pumps 101-10n is described as follows. The threshold voltage of each of the third NMOSFET 42, the fourth NMOSFET 44, the fifth NMOSFET 46, the sixth NMOSFET 48, the seventh NMOSFET 50, and the eighth NMOSFET 52 is defined as Vt. Take the negative charge pump 101 as an example. Thus, the voltage of node n1 is zero voltage. In the first duration t1, the voltages of nodes n2, n3, n4, and n5 are respectively −VDD, VDD−Vt, −VDD, and 0. Thus, the fifth NMOSFET 46 and the seventh NMOSFET 50 are turned on to transfer charges while the third NMOSFET 42 and the eighth NMOSFET 52 are turned off. By the way, the fourth NMOSFET 44 is turned on to ensure the third NMOSFET 42 and the eighth NMOSFET 52 being fully turned off. In the second duration t2, the voltage of node n3 drops to −Vt to turn off the fifth NMOSFET 46 while the others remain. In the third duration t3, the voltages of nodes n2, n3, n4, and n5 are all −VDD, such that the fourth NMOSFET 44 and the sixth NMOSFET 48 are turned on to ensure the rest of the switches being fully turned off. Therefore, any return-back leakage paths do not exist. In the fourth duration t4, the voltages of nodes n2 and n4 respectively rise to −Vt and −VDD. In addition to turning on the eighth NMOSFET 52, the others remain. In the fifth duration t5, the voltage of node n2 drops to VDD−Vt to turn on the third NMOSFET 42 while the others remain. In the sixth duration t6, the voltages of nodes n2, n3, n4, and n5 are respectively −Vt, −VDD, 0, and −VDD. In the seventh duration t7, the voltages of nodes n2, n3, n4, and n5 are all −VDD. The impact of this duration is similar to that of the third duration t3. In the eighth duration t8, the voltages of nodes n3 and n5 respectively rise to −Vt and 0 while the others remain. In addition to turning on the seventh NMOSFET 50, the others remain. In the abovementioned durations, the voltage of node n6 is always −VDD. Besides, in the negative charge pump 102, the voltages of nodes n1, n2, n3, n4, n5, and n6 decrease by VDD. By the same token, the voltages of nodes n1, n2, n3, n4, n5, and n6 decrease by 2VDD in the negative charge pump 103. The voltages of nodes n1, n2, n3, n4, n5, and n6 decrease by 3VDD in the negative charge pump 104.

In conclusion, the present invention uses charge pumps each realized with a capacitive converter to generate a direct-current (DC) output voltage lower than an input voltage, reconfigures a cascaded architecture of charge pumps to reduce excessive power consumption, outputs a wide voltage range, and maintains high power conversion efficiency.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:
1. A negative high-voltage generation device with multi-stage selection having an input and an output, and the negative high-voltage generation device with multi-stage selection comprising:
   a plurality of negative charge pumps electrically cascaded between the input and the output and configured to receive zero voltage through the input;
   a plurality of electrical switches coupled to the input; and
   a control device coupled to the plurality of electrical switches and configured to turn off at least one of the plurality of electrical switches close to the output and to turn on remains of the plurality of electrical switches, and the plurality of negative charge pumps and the plurality of electrical switches are configured to use zero voltage to generate a negative voltage at the output,
   wherein the control device further comprises:
      a stage controller configured to receive and output a plurality of control voltages and configured to generate a plurality of biasing voltages according to the plurality of control voltages; and
      a plurality of negative level shifters coupled to the stage controller and respectively coupled to the plurality of electrically switches, a node between neighboring two of the plurality of negative charge pumps is coupled to one of the plurality of negative level shifters, the output is coupled to one of the plurality of negative level shifters, the plurality of negative level shifters are configured to respectively receive the plurality of control voltages and to respectively receive the plurality of biasing voltages, thereby using the plurality of control voltages and the plurality of biasing voltages to turn off at least one of the plurality of electrical switches close to the output and to turn on remains of the plurality of electrical switches, and the plurality of negative charge pumps and the plurality of electrical switches are configured to use zero voltage to generate a negative voltage at the output.

2. The negative high-voltage generation device with multi-stage selection according to claim 1, wherein the plurality of electrical switches are N-channel metal oxide semiconductor field effect transistors (NMOSFETs).

3. The negative high-voltage generation device with multi-stage selection according to claim 2, wherein each of the plurality of negative level shifters further comprises:
   a first P-channel metal oxide semiconductor field effect transistors (PMOSFET) with a source thereof coupled to the stage controller and configured to receive one of the plurality of biasing voltages, and a gate of the first PMOSFET is coupled to the stage controller and configured to receive one of the plurality of control voltages;
   a first N-channel metal oxide semiconductor field effect transistors (NMOSFET) with a drain thereof coupled to a drain of the first PMOSFET, and a source of the first NMOSFET is coupled to the output or the node and configured to receive a node voltage at the node or the negative voltage;
an inverter with an input terminal thereof coupled to the gate of the first PMOSFET and the stage controller and configured to receive one of the plurality of control voltages;
a second P-channel metal oxide semiconductor field effect transistors (PMOSFET) with a source thereof coupled to the stage controller and the source of the first PMOSFET and configured to receive one of the plurality of biasing voltages, a gate of the second PMOSFET is coupled to an output terminal of the inverter, and a drain of the second PMOSFET is coupled to a gate of the first NMOSFET;
a second N-channel metal oxide semiconductor field effect transistors (NMOSFET) with a drain thereof coupled to the drain of the second PMOSFET and the gate of the first NMOSFET, a gate of the second NMOSFET is coupled to the drains of the first NMOSFET and the first PMOSFET, and a source of the second NMOSFET is coupled to the output or the node and configured to receive the node voltage or the negative voltage; and
a buffer with an input terminal thereof coupled to the drains of the second NMOSFET and the second PMOSFET and the gate of the first NMOSFET, an output terminal of the buffer is coupled to one of the plurality of electrical switches, the first NMOSFET, the first PMOSFET, the second NMOSFET, the second PMOSFET, the inverter, and the buffer are configured to use one of the plurality of control voltages, one of the plurality of biasing voltages, and either of the node voltage or the negative voltage to turn on or turn off one of the plurality of electrical switches.

4. The negative high-voltage generation device with multi-stage selection according to claim 3, wherein the node voltage is smaller than zero voltage.

5. The negative high-voltage generation device with multi-stage selection according to claim 3, wherein the output terminal of the buffer generates the node voltage or the negative voltage to turn off one of the plurality of electrical switches when the gate of the first PMOSFET and the input terminal of the inverter receive one of the plurality of control voltages equal to zero voltage.

6. The negative high-voltage generation device with multi-stage selection according to claim 3, wherein the output terminal of the buffer generates one of the plurality of biasing voltages equal to a positive power voltage to turn on one of the plurality of electrical switches when the gate and the source of the first PMOSFET, the source of the second PMOSFET, and the input terminal of the inverter receive one of the plurality of biasing voltages equal to the positive power voltage.

7. The negative high-voltage generation device with multi-stage selection according to claim 6, wherein each of the plurality of negative charge pumps is configured to receive a first clock signal, a second clock signal, a third clock signal, and a fourth clock signal and configured to use the first clock signal, the second clock signal, the third clock signal, the fourth clock signal, and either of one of the node voltages or zero voltage to generate another of the node voltages or the negative voltage, the first clock signal, the second clock signal, the third clock signal, and the fourth clock signal have an identical period, and the period includes a first duration, a second duration, a third duration, a fourth duration, a fifth duration, a sixth duration, a seventh duration, and an eighth duration sequentially appearing;
the first clock signal, the second clock signal, the third clock signal, and the fourth clock signal are respectively zero voltage, zero voltage, the positive power voltage, and the positive power voltage in the first duration;
the first clock signal, the second clock signal, the third clock signal, and the fourth clock signal are respectively zero voltage, zero voltage, zero voltage, and the positive power voltage in the second duration;
the first clock signal, the second clock signal, the third clock signal, and the fourth clock signal are respectively zero voltage, zero voltage, zero voltage, and zero voltage in the third duration;
the first clock signal, the second clock signal, the third clock signal, and the fourth clock signal are respectively zero voltage, the positive power voltage, zero voltage, and zero voltage in the fourth duration;
the first clock signal, the second clock signal, the third clock signal, and the fourth clock signal are respectively the positive power voltage, the positive power voltage, zero voltage, and zero voltage in the fifth duration;
the first clock signal, the second clock signal, the third clock signal, and the fourth clock signal are respectively zero voltage, the positive power voltage, zero voltage, and zero voltage in the sixth duration;
the first clock signal, the second clock signal, the third clock signal, and the fourth clock signal are respectively zero voltage, zero voltage, zero voltage, and zero voltage in the seventh duration; and
the first clock signal, the second clock signal, the third clock signal, and the fourth clock signal are respectively zero voltage, zero voltage, zero voltage, and the positive power voltage in the eighth duration.

8. The negative high-voltage generation device with multi-stage selection according to claim 7, wherein each of the plurality of negative charge pumps further comprises:
a first capacitor having a first end and a second end, and the first end of the first capacitor is configured to receive the first clock signal;
a second capacitor having a third end and a fourth end, and the third end of the second capacitor is configured to receive the second clock signal;
a third capacitor having a fifth end and a sixth end, and the fifth end of the third capacitor is configured to receive the third clock signal;
a fourth capacitor having a seventh end and an eighth end, and the seventh end of the fourth capacitor is configured to receive the fourth clock signal;
a third N-channel metal oxide semiconductor field effect transistor (NMOSFET) with a gate thereof coupled to the second end, a drain of the third NMOSFET is coupled to the node or the input, and a source of the third NMOSFET is coupled to the fourth end;
a fourth N-channel metal oxide semiconductor field effect transistor (NMOSFET) with a drain thereof coupled to the second end, a source of the fourth NMOSFET is coupled to the fourth end, and a gate of the fourth NMOSFET is coupled to the drain of the third NMOSFET;
a fifth N-channel metal oxide semiconductor field effect transistor (NMOSFET) with a drain thereof coupled to the drain of the third NMOSFET, a gate of the fifth NMOSFET is coupled to the sixth end, and a source of the fifth NMOSFET is coupled to the eighth end;

a sixth N-channel metal oxide semiconductor field effect transistor (NMOSFET) with a drain thereof coupled to the sixth end, a source of the sixth NMOSFET is coupled to the eighth end, and a gate of the sixth NMOSFET is coupled to the gate of the fourth NMOSFET;

a seventh N-channel metal oxide semiconductor field effect transistor (NMOSFET) with a drain thereof coupled to the fourth end, a source of the seventh NMOSFET is coupled to the output or the node, and a gate of the seventh NMOSFET is coupled to the eighth end; and an eighth N-channel metal oxide semiconductor field effect transistor (NMOSFET) with a drain thereof coupled to the eighth end, a source of the eighth NMOSFET is coupled to the source of the seventh NMOSFET, a gate of the eighth NMOSFET is coupled to the fourth end, and the first capacitor, the second capacitor, the third capacitor, the fourth capacitor, the third NMOSFET, the fourth NMOSFET, the fifth NMOSFET, the sixth NMOSFET, the seventh NMOSFET, and the eighth NMOSFET are configured to receive one of the node voltages or zero voltage and configured to decrease it by a fixed voltage to generate another of the node voltages or the negative voltage.

9. The negative high-voltage generation device with multi-stage selection according to claim 8, wherein the fixed voltage is equal to the positive power voltage.

10. The negative high-voltage generation device with multi-stage selection according to claim 6, wherein each of the plurality of control voltages is equal to zero voltage or the positive power voltage, and each of the plurality of biasing voltages is equal to the positive power voltage.

* * * * *